US011519719B2

(12) United States Patent
Shchegrov et al.

(10) Patent No.: US 11,519,719 B2
(45) Date of Patent: *Dec. 6, 2022

(54) TRANSMISSION SMALL-ANGLE X-RAY SCATTERING METROLOGY SYSTEM

(71) Applicant: KLA Corporation, Milpitas, CA (US)

(72) Inventors: Andrei V. Shchegrov, Campbell, CA (US); Antonio Arion Gellineau, Santa Clara, CA (US); Sergey Zalubovsky, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 46 days.

This patent is subject to a terminal disclaimer.

(21) Appl. No.: 17/002,614

(22) Filed: Aug. 25, 2020

(65) Prior Publication Data

US 2021/0088325 A1 Mar. 25, 2021

Related U.S. Application Data

(63) Continuation of application No. 15/950,823, filed on Apr. 11, 2018, now Pat. No. 10,767,978.
(Continued)

(51) Int. Cl.
*G01N 23/201* (2018.01)
*G01B 11/14* (2006.01)
(Continued)

(52) U.S. Cl.
CPC .......... *G01B 11/14* (2013.01); *G01B 11/0616* (2013.01); *G01B 11/26* (2013.01);
(Continued)

(58) Field of Classification Search
CPC .... G01B 11/14; G01B 11/0616; G01B 15/00; G01B 11/26; G01B 15/04; G01B 15/02;
(Continued)

(56) References Cited

U.S. PATENT DOCUMENTS 5,608,526 A 3/1997 Piwonka-Corle et al.
5,859,424 A 1/1999 Norton et al.
(Continued)

FOREIGN PATENT DOCUMENTS

CN 102792156 A 11/2012
TW 201543003 A 11/2015
(Continued)

OTHER PUBLICATIONS

Bunday, Benjamin et al., "Metrology capabilities and needs for 7nm and 5nm logic nodes," Proc. SPIE 10145, Metrology, Inspection, and Process Control for Microlithography XXXI, 101450G (Mar. 28, 2017).
(Continued)

*Primary Examiner* — Irakli Kiknadze
(74) *Attorney, Agent, or Firm* — Spano Law Group; Joseph S. Spano

(57) ABSTRACT

Methods and systems for characterizing dimensions and material properties of semiconductor devices by transmission small angle x-ray scatterometry (TSAXS) systems having relatively small tool footprint are described herein. The methods and systems described herein enable Q space resolution adequate for metrology of semiconductor structures with reduced optical path length. In general, the x-ray beam is focused closer to the wafer surface for relatively small targets and closer to the detector for relatively large targets. In some embodiments, a high resolution detector with small point spread function (PSF) is employed to mitigate detector PSF limits on achievable Q resolution. In some embodiments, the detector locates an incident photon with sub-pixel accuracy by determining the centroid of a cloud of electrons stimulated by the photon conversion event. In some embodiments, the detector resolves one or
(Continued)

more x-ray photon energies in addition to location of incidence.

20 Claims, 8 Drawing Sheets

Related U.S. Application Data

(60) Provisional application No. 62/485,497, filed on Apr. 14, 2017.

(51) Int. Cl.
*H01L 21/66* (2006.01)
*G01B 11/26* (2006.01)
*G03F 7/20* (2006.01)
*G01N 21/47* (2006.01)
*H01J 37/28* (2006.01)
*G01N 21/21* (2006.01)
*G01B 11/06* (2006.01)
*H05G 2/00* (2006.01)
*G01N 21/95* (2006.01)
*G01B 15/00* (2006.01)
*G01N 23/20* (2018.01)

(52) U.S. Cl.
CPC .......... *G01B 15/00* (2013.01); *G01N 21/211* (2013.01); *G01N 21/4785* (2013.01); *G01N 21/9501* (2013.01); *G03F 7/70616* (2013.01); *G03F 7/70625* (2013.01); *G03F 7/70633* (2013.01); *H01J 37/28* (2013.01); *H01L 22/12* (2013.01); *H05G 2/003* (2013.01); *G01N 23/20* (2013.01); *G01N 2223/6116* (2013.01); *G21K 2201/06* (2013.01)

(58) Field of Classification Search
CPC ............. G01B 2210/56; G01N 23/201; G01N 21/211; G01N 23/02; G01N 21/4785; G01N 21/9501; G01N 23/20066; G01N 23/2055; G01N 23/205; G01N 23/207; G01N 23/223; G01N 2223/645; G01N 2223/6116; G01N 23/20; G01N 2223/6462; G01N 2223/03; G01N 2223/05; G01N 2223/056; G01N 2223/0566; G01N 2223/302; G01N 2223/076; G03F 7/70633; G03F 7/70625; G03F 7/70616; H05G 2/003; H01J 37/28; H01L 22/12; G06T 7/60; G21K 1/062; G21K 2201/06; B82Y 10/00
USPC .......................................... 378/70, 86, 87, 90
See application file for complete search history.

(56) References Cited

U.S. PATENT DOCUMENTS

| | | |
|---|---|---|
| 6,023,338 A | 2/2000 | Bareket |
| 6,269,144 B1 | 7/2001 | Dube et al. |
| 6,429,943 B1 | 8/2002 | Opsal et al. |
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |
| 7,242,477 B2 | 7/2007 | Mieher et al. |
| 7,321,426 B1 | 1/2008 | Poslavsky et al. |
| 7,406,153 B2 | 7/2008 | Berman |
| 7,478,019 B2 | 1/2009 | Zangooie et al. |
| 7,626,702 B2 | 12/2009 | Ausschnitt et al. |
| 7,656,528 B2 | 2/2010 | Abdulhalim et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,920,676 B2 | 4/2011 | Yun et al. |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 9,243,886 B1 | 1/2016 | Kuznetsov et al. |
| 9,606,073 B2 | 3/2017 | Mazor et al. |
| 10,767,978 B2 * | 9/2020 | Shchegrov ............. H01L 22/12 |
| 2003/0021465 A1 | 1/2003 | Adel et al. |
| 2005/0254029 A1 * | 11/2005 | Banine ................ G03F 7/70191 355/53 |
| 2007/0221842 A1 | 9/2007 | Morokuma et al. |
| 2009/0152463 A1 | 6/2009 | Toyoda et al. |
| 2010/0223016 A1 | 9/2010 | Gibson et al. |
| 2010/0231880 A1 * | 9/2010 | Kawabe .............. G03F 7/70075 359/619 |
| 2011/0266440 A1 | 11/2011 | Boughorbel et al. |
| 2012/0127467 A1 | 5/2012 | Ivanov et al. |
| 2012/0292502 A1 | 11/2012 | Langer et al. |
| 2012/0294426 A1 | 11/2012 | Panine et al. |
| 2013/0208279 A1 | 8/2013 | Smith |
| 2013/0304424 A1 | 11/2013 | Bakeman et al. |
| 2014/0019097 A1 | 1/2014 | Bakeman et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0300965 A1 | 10/2015 | Sezginer et al. |
| 2016/0202193 A1 | 7/2016 | Hench et al. |
| 2016/0320319 A1 * | 11/2016 | Hench ................. G03F 7/70633 |
| 2017/0167862 A1 | 6/2017 | Dziura et al. |

FOREIGN PATENT DOCUMENTS

| | | |
|---|---|---|
| WO | 2017044283 A1 | 7/2015 |
| WO | 2017044283 A1 | 3/2016 |
| WO | 2015112444 A1 | 3/2017 |

OTHER PUBLICATIONS

Kline, R. Joseph, et al., "X-ray scattering critical dimensional metrology using a compact x-ray source for next generation semiconductor devices," Journal of Micro/Nanolithography, MEMS, and MOEMS 16(1):014001 (Jan.-Mar. 2017).

Lemaillet, Paul, et al., "Intercomparision between optical and x-ray scatterometry measurements of FinFET structures," Proc. SPIE Metrology, Inspection, and Process Control for Microlithography XXVII, V. 8681, p. 86810Q (2013).

* cited by examiner

TRANSMISSION SMALL-ANGLE X-RAY SCATTERING METROLOGY SYSTEM

CROSS REFERENCE TO RELATED APPLICATION

The present application for patent is a continuation of, and claims priority under 35 U.S.C. § 120 from, U.S. patent application Ser. No. 15/950,823, entitled "Transmission Small-Angle X-Ray Scattering Metrology System," filed Apr. 11, 2018, which, in turn, claims priority under 35 U.S.C. § 119 from U.S. provisional patent application Ser. No. 62/485,497, filed Apr. 14, 2017, the subject matter of each is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension (SCR) measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled with available measurements.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance. X-ray reflectometers also suffer from penetration issues that limit their effectiveness when measuring high aspect ratio structures.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

Transmission, Small-Angle X-Ray Scatterometry (T-SAXS) systems employing photon at a hard X-ray energy level (>15 keV) have shown promise to address challenging measurement applications. Various aspects of the application of SAXS technology to the measurement of critical dimensions (CD-SAXS) and overlay (OVL-SAXS) are described in 1) U.S. Pat. No. 7,929,667 to Zhuang and Fielden, entitled "High-brightness X-ray metrology," 2)

U.S. Patent Publication No. 2014/0019097 by Bakeman, Shchegrov, Zhao, and Tan, entitled "Model Building And Analysis Engine For Combined X-Ray And Optical Metrology," 3) U.S. Patent Publication No. 2015/0117610 by Veldman, Bakeman, Shchegrov, and Mieher, entitled "Methods and Apparatus For Measuring Semiconductor Device Overlay Using X-Ray Metrology," 4) U.S. Patent Publication No. 2016/0202193 by Hench, Shchegrov, and Bakeman, entitled "Measurement System Optimization For X-Ray Based Metrology," 5) U.S. Patent Publication No. 2017/0167862 by Dziura, Gellineau, and Shchegrov, entitled "X-ray Metrology For High Aspect Ratio Structures," and 6) U.S. patent application Ser. No. 15/419,130 by Gellineau, Dziura, Hench, Veldman, and Zalubovsky, entitled "Full Beam Metrology for X-Ray Scatterometry Systems," the content of each of these documents is incorporated herein by reference in its entirety. The aforementioned patent documents are assigned to KLA-Tencor Corporation, Milpitas, Calif. (USA). In addition, U.S. Pat. No. 9,606,073 to Mazor, et al. entitled "X-ray scatterometry apparatus" describes various aspects of the application of SAXS technology to semiconductor structures, the content of which is incorporated herein by reference in its entirety.

SAXS has also been applied to the characterization of materials and other non-semiconductor related applications. Exemplary systems have been commercialized by several companies, including Xenocs SAS (www.xenocs.com), Bruker Corporation (www.bruker.com), and Rigaku Corporation (www.rigaku.com/en). Both Bruker and Rigaku offer small angle x-ray scatterometry systems and wide angle x-ray scatterometery systems named "Nanostar" and "Nanopix", respectively. These systems include adjustable sample-to-detector distance.

Research on CD-SAXS metrology of semiconductor structures is also described in scientific literature. Most research groups have employed high-brightness X-ray synchrotron sources which are not suitable for use in a semiconductor fabrication facility due to their immense size, cost, etc. One example of such a system is described in the article entitled "Intercomparison between optical and x-ray scatterometry measurements of FinFET structures" by Lemaillet, Germer, Kline et al., Proc. SPIE, v.8681, p. 86810Q (2013), the content of each of these documents is incorporated herein by reference in its entirety. More recently, a group at the National Institute of Standards and Technology (NIST) has initiated research employing compact and bright X-ray sources similar those described in U.S. Pat. No. 7,929,667. This research is described in an article entitled "X-ray scattering critical dimensional metrology using a compact x-ray source for next generation semiconductor devices," J. Micro/Nanolith. MEMS MOEMS 16(1), 014001 (January-March 2017), the content of each of these documents is incorporated herein by reference in its entirety.

SAXS systems employ several different types of detectors including hybrid pixel photon counting detectors, charge integrating pixel array detectors, gaseous avalanche detectors, etc. Pixel sizes of available detectors range from about 50 micrometers to approximately 200 micrometers. Prototypes having 25 micrometer pixels are currently under development.

A substantial disadvantage of all prior SAXS architectures is the substantial size of the instrument required to measure typical semiconductor structures. Fine angular resolution is needed to resolve the diffraction image at the detector. Currently, this resolution is achieved by increasing the length of the instrument.

In one example, the "Nanostar" system manufactured by Bruker may be configured with a sample to detector distance of 1070 mm, a detector having a 68 micrometer pixel size, and q-space resolution of 5e-3 Angstroms-1.

In semiconductor fabrication facilities, metrology and inspection tools must conform to relatively small footprint sizes to maximize the use of expensive cleanroom space and accommodate more tools for higher throughput. Hence, tool length of current SAXS systems must be reduced from current levels to be useful in a practical semiconductor manufacturing setting.

Furthermore, the resolution of hard X-ray detectors also limits the ability of current systems to reconstruct detailed profiles of semiconductor devices. For example, current vertical-NAND (VNAND) structures are fabricated with fundamental pitch lengths on the order of micrometers. Measurement of these structures with hard X-rays creates very fine diffraction patterns that cannot be resolved based on angular resolution alone without resorting to impractical tool lengths (e.g., ~40 m tool length). As such, this measurement application is infeasible with current tools.

In summary, current CD/OVL SAXS systems are not suitable for implementation in a production semiconductor fabrication facility due to excessively large footprint, limited resolution, and reliance on angular order separation. To further improve device performance, the semiconductor industry continues to focus on vertical integration, rather than lateral scaling. Thus, accurate measurement of complex, fully three dimensional structures is crucial to ensure viability and continued scaling improvements. Future metrology applications present challenges for metrology due to increasingly small resolution requirements, multi-parameter correlation, increasingly complex geometric structures including high aspect ratio structures, and increasing use of opaque materials. Thus, methods and systems for improved x-ray scatterometry measurements, including improved resolution and smaller footprint, are desired.

SUMMARY

Methods and systems for characterizing dimensions and material properties of semiconductor devices by transmission small angle x-ray scatterometry (TSAXS) systems having relatively small tool footprint are described herein. The methods and systems described herein enable Q space resolution adequate for metrology of semiconductor structures with reduced optical path length.

In one aspect, a TSAXS measurement system employs hard x-ray illumination over a relatively short optical path length (e.g., less than three meters from illumination source to detector) to measure targets ranging from relatively small dimensions (e.g., approximately 50 nanometers) to relatively large dimensions (e.g., up to 10 micrometers).

In a further aspect, a TSAXS measurement system illuminates a sample with an X-ray beam focused less than 200 millimeters before the wafer surface, at the wafer surface, at the detector surface, or at any location between the wafer surface and the detector surface to mitigate optical focus limits on achievable Q resolution. In general, the x-ray beam is focused closer to the wafer surface for metrology applications involving relatively small targets that must be illuminated with the smallest possible illumination spot size. The x-ray beam is focused closer to the detector for metrology applications involving relatively large targets where high image resolution and photon flux is desired.

In another further aspect, a TSAXS measurement system includes a high resolution detector with a small PSF to mitigate detector PSF limits on achievable Q resolution. Regardless of where the optical focus is located relative the wafer and the detector, a high resolution detector is advantageous when the wafer-detector distance, D, is reduced to a relatively small value (e.g., less than one meter).

In another aspect, the location of the centroid of a cloud of electrons stimulated by a photon conversion event is calculated by the detector. The location of the centroid provides the location of the incident photon with sub-pixel accuracy. This effectively reduces the pixel size and enables Q resolution beyond the geometric limits. Sub-pixel spatial interpolation as described herein is preferred for TSAXS measurements of semiconductor structures with a wafer-detector distance less than one meter.

In some embodiments, a TSAXS system having a relatively short optical path length is configured with a horizontal optical path incident on a wafer positioned vertically (i.e., normal to wafer surface is approximately perpendicular to the gravity vector). However, in some other embodiments, a TSAXS system having a relatively short optical path length is configured with a vertical optical path incident on a wafer positioned horizontally (i.e., normal to wafer surface is approximately parallel to the gravity vector). By orienting the beam line vertically, a smaller tool footprint may be achieved and wafer handling is simplified.

In another further aspect, the x-ray detector resolves one or more x-ray photon energies and produces signals for each x-ray energy component indicative of properties of the specimen. In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value.

In another aspect, a TSAXS system is configured to measure a target based on spatially separated orders in one direction, but overlapping orders in the orthogonal direction. In some of these embodiments, the value(s) of one or more parameters of interest are determined in the direction where the diffracted orders are spatially separated. These parameter values are subsequently employed to determine the value(s) of one or more parameters of interest based on the overlapping orders.

In another aspect, the slits of a beam shaping slit mechanism are located in close proximity to the specimen under measurement to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101. In other examples, beam divergence is controlled by beam shaping slits located less than 100 millimeters from the specimen.

In another further aspect, a T-SAXS system is employed to determine properties of a specimen (e.g., structural parameter values) based on one or more diffraction orders of scattered light.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for characterizing dimensions and material properties of semiconductor devices by transmission small angle x-ray scatterometry (TSAXS) systems having relatively small tool footprint are described herein. Such systems and techniques are employed to measure structural and material characteristics associated with different semiconductor fabrication processes. In some examples, TSAXS is employed to measure critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM).

The use of high brightness TSAXS enables high flux x-ray radiation penetration into opaque areas of the target. Examples of measureable geometric parameters using x-ray scatterometry includes pore size, pore density, line edge roughness, line width roughness, side wall angle, profile, critical dimension, overlay, edge placement error, and pitch. An example of a measureable material parameter includes electron density. In some examples, x-ray scatterometry enables the measurement of features smaller than 50 nm as well as advanced semiconductor structures such as STT- RAM, V-NAND, DRAM, PC-RAM and Re-RAM, where measurements of geometrical parameters and material parameters are needed.

Figure 1:
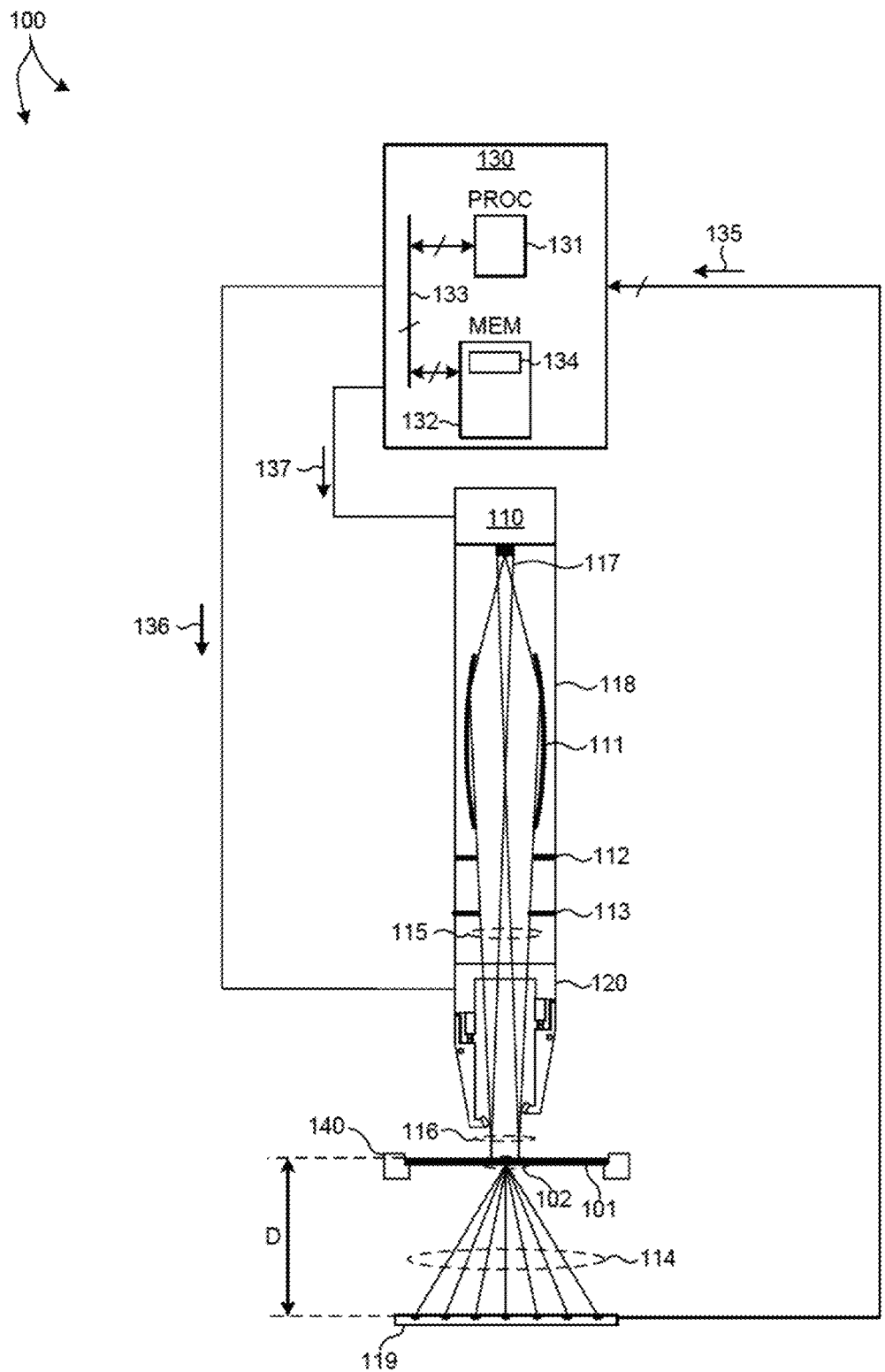
FIG. 1 is a diagram illustrative of a metrology system 100 configured to perform x-ray scatterometry measurements as described herein.

FIG. 1 illustrates an embodiment of a T-SAXS metrology tool 100 for measuring characteristics of a specimen in at least one novel aspect. As shown in FIG. 1, the system 100 may be used to perform T-SAXS measurements over an inspection area 102 of a specimen 101 illuminated by an illumination beam spot.

In the depicted embodiment, metrology tool 100 includes an x-ray illumination source 110 configured to generate x-ray radiation suitable for T-SAXS measurements. In some embodiments, the x-ray illumination source 110 is configured to generate wavelengths between 0.01 nanometers and 1 nanometer. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110. In one example, an inverse Compton source available from Lyncean Technologies, Inc., Palo Alto, Calif. (USA) may be contemplated. Inverse Compton sources have an additional advantage of being able to produce x-rays over a range of photon energies, thereby enabling the x-ray source to deliver x-ray radiation at different, selectable wavelengths.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size 102 on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. An additional intermediate slit 113 is located in the beam path between beam divergence control slit 112 and beam shaping slit mechanism 120. Intermediate slit 113 provides additional beam shaping. In general, however, intermediate slit 113 is optional.

Beam shaping slit mechanism 120 is located in the beam path immediately before specimen 101. In one aspect, the slits of beam shaping slit mechanism 120 are located in close proximity to specimen 101 to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101. In other examples, beam divergence is controlled by beam shaping slits located less than 100 millimeters from specimen 101.

In some embodiments, beam shaping slit mechanism 120 includes multiple, independently actuated beam shaping slits. In one embodiment, beam shaping slit mechanism 120 includes four independently actuated beam shaping slits. These four beams shaping slits effectively block a portion of incoming beam 115 and generate an illumination beam 116 having a box shaped illumination cross-section.

Figure 2:
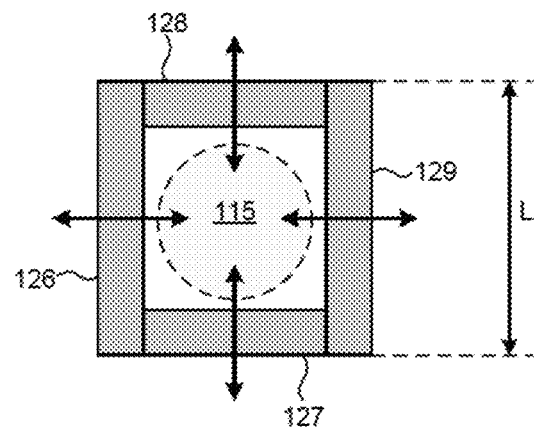
FIG. 2 depicts slits of a beam shaping slit mechanism in positions that do not block an incoming beam.
Figure 3:
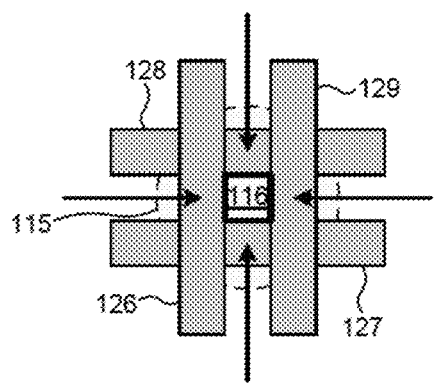
FIG. 3 depicts slits of a beam shaping slit mechanism in positions that block a portion of an incoming beam.

FIGS. 2 and 3 depict an end view of beam shaping slit mechanism 120 depicted in FIG. 1 in two different configurations. As illustrated in FIGS. 2 and 3, the beam axis is perpendicular to the drawing page. As depicted in FIG. 2, incoming beam 115 has a large cross-section. In some embodiments, incoming beam 115 has a diameter of approximately one millimeter. Furthermore, the location of incoming beam 115 within beam shaping slits 126-129 may have an uncertainty of approximately three millimeters due to beam pointing errors. To accommodate the size of the incoming beam and the uncertainty of the beam location, each slit has a length, L, of approximately six millimeters. As depicted in FIG. 2, each slit is moveable in a direction perpendicular to the beam axis. In the illustration of FIG. 2, slits 126-129 are located at a maximum distance from the beam axis (i.e., the slits are fully open and they are not restricting the light passing through beam shaping slit mechanism 120.

FIG. 3 depicts slits 126-129 of beam shaping slit mechanism 120 in positions that block a portion of incoming beam 115, such that outgoing beam 116 delivered to the specimen under measurement has reduced size and well-defined shape. As depicted in FIG. 3, each of slits 126-129 has moved inward, toward the beam axis to achieve the desired output beam shape.

Slits 126-129 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit. In some embodiments, each slit has a rectangular cross-section having a width is approximately 0.5 millimeters and a height of approximately 1-2 millimeters. As depicted in FIG. 2, the length, L, of a slit is approximately 6 millimeters.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

X-ray detector 119 collects x-ray radiation 114 scattered from specimen 101 and generates an output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 140 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In a further aspect, a T-SAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on T-SAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of angle of incidence and azimuth angle to increase the precision and accuracy of measured parameter values. This approach reduces correlations among parameters by extending the number and diversity of data sets available for analysis to include a variety of large-angle, out of plane orientations. For example, in a normal orientation, T-SAXS is able to resolve the critical dimension of a feature, but is largely insensitive to sidewall angle and height of a feature. However, by collecting measurement data over a broad range of out of plane angular orientations, the sidewall angle and height of a feature can be resolved. In other examples, measurements performed at large ranges of angle of incidence and azimuth angle provide sufficient resolution and depth of penetration to characterize high aspect ratio structures through their entire depth.

Measurements of the intensity of diffracted radiation as a function of x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 4:
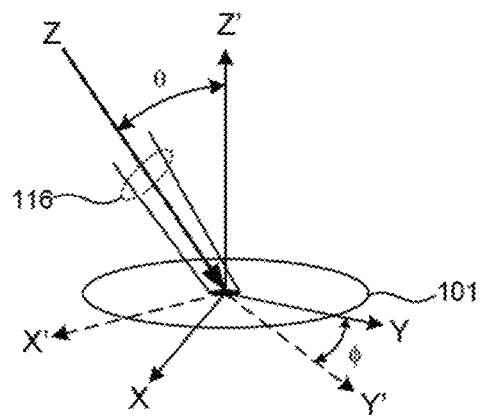
FIG. 4 depicts an x-ray illumination beam incident on a wafer at a particular orientation described by angles φ and θ.

Each orientation of the illuminating x-ray beam 116 relative to the surface normal of a semiconductor wafer 101 is described by any two angular rotations of wafer 101 with respect to the x-ray illumination beam 115, or vice-versa. In one example, the orientation can be described with respect to a coordinate system fixed to the wafer. FIG. 4 depicts x-ray illumination beam 116 incident on wafer 101 at a particular orientation described by an angle of incidence, θ, and an azimuth angle, φ. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 4, x-ray illumination beam 116 is aligned with the Z-axis and thus lies within the XZ plane. Angle of incidence, θ, describes the orientation of the x-ray illumination beam 116 with respect to the surface normal of the wafer in the XZ plane. Furthermore, azimuth angle, φ, describes the orientation of the XZ plane with respect to the X'Z' plane. Together, θ and φ, uniquely define the orientation of the x-ray illumination beam 116 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In one aspect, a TSAXS measurement system employs hard x-ray illumination (e.g., 15 keV or higher) over a relatively short optical path length (e.g., less than three meters from illumination source to detector) to measure targets ranging from relatively small dimensions (e.g., approximately 50 nanometers) to relatively large dimensions (e.g., up to 10 micrometers). In general, the methods and systems described herein enable Q space resolution adequate for metrology of semiconductor structures with reduced optical path length.

A geometrical limit on minimum achievable resolution of a TSAXS system is often characterized by a minimum Q value, $Q_{min}$. $Q_{min}$ is expressed by equation (1), where p is pixel size at the detector, D is the distance between the sample under measurement and the detector, and λ is the wavelength of the x-ray radiation.

$$Q_{min} = \frac{4\pi}{\lambda} \frac{p}{D} \qquad (1)$$

As illustrated by equation (1), as the distance, D, between the sample under measurement and the detector is decreased, the minimum achievable Q value for a given pixel size increases. To maintain Q resolution (i.e., small value of $Q_{min}$) for a reduced value of D requires a proportional decrease in pixel size. Metrology of state of the art semiconductor metrology targets requires a TSAXS system with a Q value less than 0.01 $nm^{-1}$, which is not currently achieved by commercially viable TSAXS systems limited by pixel size.

Although equation (1) describes a geometrical limit on Q resolution, there are other limits on Q resolution that must be suppressed to reach the geometrical limit. In one example, the spatial extent of optical focus at the detector limits achievable Q resolution. In another example, the point spread function (PSF) of the optical system at the detector limits achievable Q resolution.

In a further aspect, the TSAXS measurements described herein involve illuminating a sample with an X-ray beam focused less than 200 millimeters before the wafer surface, at the wafer surface, at the detector surface, or at any location between the wafer surface and the detector surface to mitigate optical focus limits on achievable Q resolution. In general, the x-ray beam is focused closer to the wafer surface for metrology applications involving relatively small targets that must be illuminated with the smallest possible illumination spot size. Moreover, the x-ray beam is focused closer to the detector for metrology applications involving relatively large targets where high image resolution and photon flux is desired.

In some embodiments, the focus of the TSAXS measurement system is located at or near the wafer surface for measurements of relatively small targets (e.g., approximately 50-100 nanometers) as illustrated in FIG. 1. By locating the illumination focus at the wafer, the measurement spot size is smallest at the structure under measurement. This minimizes signal contamination due to spillover of illumination light onto structures surrounding the target of interest. This configuration is preferred for small size targets, where signal contamination due to finite measurement spot size is limiting. However, locating the illumination focus at the wafer, rather than the detector, causes an increase in beam size incident on the detector. This increases the likelihood of overlap of diffracted portions of the incident beam due to beam divergence. This is exacerbated as the distance between the wafer and the detector is reduced to a relatively small dimension (e.g., less than 1 meter) because the spatial separation of angular orders is reduced as the distance between the wafer and detector is reduced. However, for small sized targets (e.g., less than 100 nanometers), the angular separation among diffracted orders is relatively large and the detector resolution enhancement techniques described herein overcome limitations due to detector focus limits.

Figure 5:
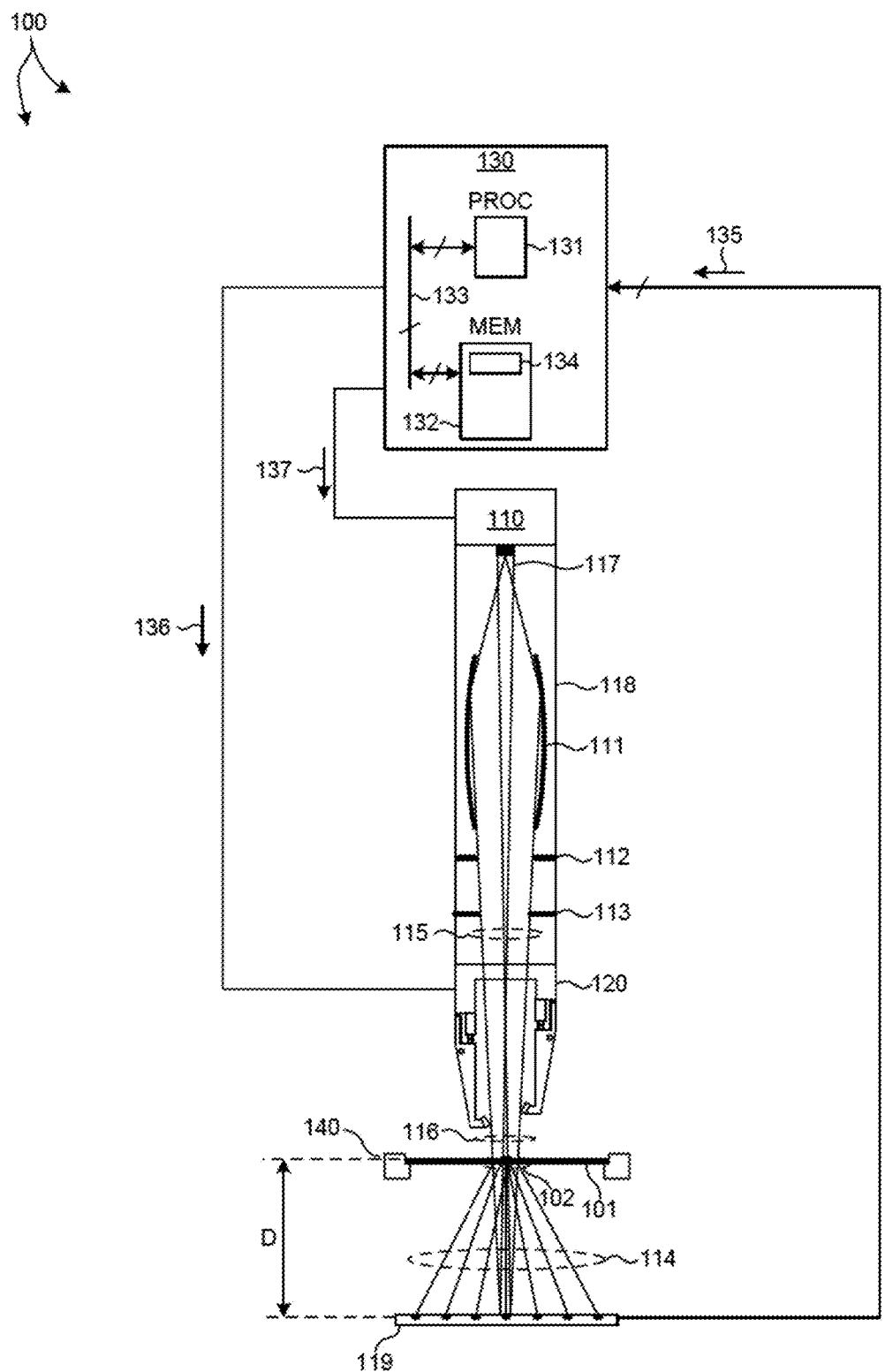
FIG. 5 is a diagram illustrative of metrology system 100 configured such that the x-ray optical focus is located at or near the detector surface.

In other embodiments, the focus of the TSAXS measurement system is located at or near the detector surface for measurements of relatively large targets (e.g., approximately 1-10 micrometers) as illustrated in FIG. 5. By locating the illumination focus at the detector, the measurement spot size is smallest at the detector, not the target under measurement. This configuration is preferred for relatively large size targets, where signal contamination due to finite measurement spot size at the wafer is not limiting because the risk of signal contamination due to spillover of illumination light onto structures surrounding the target of interest is reduced. However, the angular separation among diffracted orders is relatively small for large size targets. Thus, the spatial separation of angular orders at the detector is relatively small. This is exacerbated as the distance between the wafer and detector is reduced to a relatively small dimension (e.g., less than 1 meter). By locating the illumination focus at the detector, the likelihood of overlap of diffracted portions of the incident beam due to focus limits is minimized. Furthermore, the detector resolution enhancement techniques described herein overcome limitations due to the relatively small spatial separation of orders at the detector for relatively large target sizes.

In general, the location of optical focus may be adjusted to any location between the sample under measurement and the detector with a concomitant tradeoff of the advantages/disadvantages described hereinbefore. In general, as target sizes are reduced, it is preferred to move the optical focus closer to the wafer, or in front of the wafer, and as target sizes are increased, it is preferred to move the optical focus closer to the detector.

In a further aspect, the TSAXS measurements described herein involve a high resolution detector with a small PSF to mitigate detector PSF limits on achievable Q resolution. Regardless of where the optical focus is located relative the wafer and the detector, a high resolution detector is advantageous when the wafer-detector distance, D, is reduced to a relatively small value (e.g., less than one meter).

The Q resolution limit set by the PSF of the system depends on the requirements of the metrology and the source of the PSF. For example, with weak scattering, the PSF may need to fall to 10% in a given Q for that Q to be resolved. In other examples, the PSF may need to fall to 1% in a given Q for that Q to be resolved. To enable high Q resolution and the shortest possible wafer-detector distance, D, the TSAXS system is designed to minimize the Q independent PSF. In some examples, the pixel size of the detector is less than 100 micrometers and the detector PSF is smaller than the pixel size such that contamination of adjacent pixels from diffracted light incident of a particular pixel is less than 0.1%.

The detector material is selected to minimize transmission. Moreover, the construction of the detector minimizes PSF broadening within the detector. As a result, the system PSF is independent of the detector position. For example, detection of hard x-rays (e.g., 15 keV or more) with traditional Silicon based detectors suffers from a significant Q independent PSF. As a result a large wafer-detector distance, D, (e.g., 2 meters or more) is required to perform metrology of semiconductor structures. With reduced transmission and backscattering, the PSF limit is suppressed below the geometrical limit described by equation (1), metrology of semiconductor structures is achieved with a wafer-detector distance, D, less than one meter (e.g., D as small as 600 millimeters).

In some embodiments, a TSAXS system includes one or more photon counting detectors with high quantum efficiency and dynamic range (e.g., greater than $10^5$) and thick, highly absorptive crystal substrates (e.g., thickness greater than 500 micrometers) that absorb the incident radiation without damage and with minimal parasitic backscattering. In some embodiments, a single photon counting detector detects the position and number of detected photons.

In some embodiments, the zero order beam is collected along with higher diffraction orders. The zero order beam is several orders of magnitude more intense than the other orders. If the zero order beam is not fully absorbed in the X-Ray sensitive section of the detector, it will scatter and generate parasitic signals. The strength of these parasitic signals limits the dynamic range of the measurement. For example, if the parasitic signal is $10^{-4}$ of the largest flux signal (i.e., the zero order signal), the signals associated with many higher orders will be contaminated. Thus, it is critical that the detector (e.g., detector 119) exhibit high conversion efficiency of X-rays to electron hole pairs and high X-ray absorption to increase the effective dynamic range of the x-ray metrology.

Exemplary detector materials suitable for small footprint x-ray scatterometry include Cadmium Telluride (CdTe), Germanium (Ge) and Gallium Arsenide (GaAs) crystals, and others. In some embodiments, the detector material is selected to provide high conversion efficiency in a narrow energy band corresponding to the source energy.

In some embodiments, the thickness of the detector material is selected to achieve the desired absorption of incoming X-rays. In some embodiments, the detector is tilted with respect to the incoming X-ray beams (the various diffraction orders) to increase the path length of the X-ray beams through the detector material, and thus, increase the total amount of absorption.

In some embodiments, dual threshold detectors are employed to improve SNR.

In a further aspect, a TSAXS system is employed to determine properties of a specimen (e.g., structural parameter values) based on multiple measured diffraction orders. As depicted in FIG. 1, metrology tool 100 includes a computing system 130 employed to acquire signals 135 generated by detector 119 and determine properties of the specimen based at least in part on the acquired signals.

In a TSAXS measurement, a high aspect ratio, a manufactured structure diffracts a collimated X-ray beam into diffraction orders. Each diffraction order travels in a particular, predictable direction. The angular spacing of the diffraction orders is inversely proportional to the lattice constant of the specimen divided by the wavelength. The diffraction orders are detected by a detector array placed at some distance from the wafer. Each pixel of the detector outputs a signal that indicates the number of photons that hit the pixel.

The intensities of diffraction orders are of the form $I(m,n,\theta,\phi,\lambda)$, where $\{m,n\}$ are integer indices of diffraction orders, $\{\theta,\phi\}$ are elevation and azimuth angles of the incident beam (i.e., polar coordinates of the incident chief ray with respect to a coordinate system that is fixed to the wafer), and $\lambda$ is the wavelength of the incident X-ray.

Several noise sources perturb the illumination light as it exits the illumination and propagates toward the specimen. Exemplary disturbances include electron beam current fluctuation, temperature induced optic drift, etc. The perturbed incident flux is denoted as $F_0(1+n_1)$.

The target scatters the incident radiation in a manner that depends on the azimuth and elevation angles of the incident beam. The efficiency of light scattering into orders (m,n) can be defined as $S_{mn}(\theta,\phi)$. As the diffracted light propagates from the specimen to the detector, the beam passes through other scattering media that affect all orders similarly with some variation $(1+n_2)$ and parasitic noise $(n_3)$. In this manner the total intensity $I_{mn}$ of each order measured in a time, t, can be expressed by equation (2).

$$I_{mn}=S_{mn}(\theta,\phi)(1+n_2)(1+n_1)F_0 t+n_3 \quad (2)$$

Figure 6:
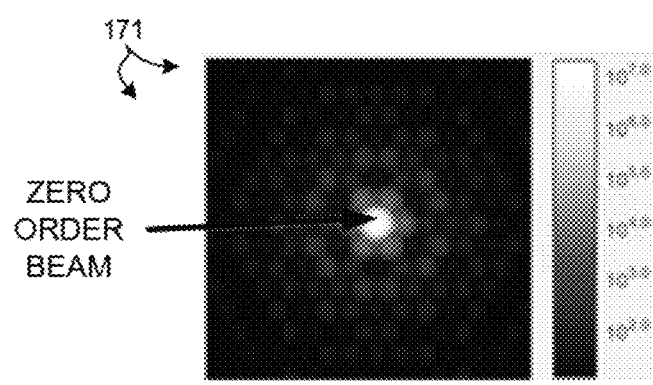
FIG. 6 depicts an image 171 of scattered orders measured by a metrology system such as metrology system 100.

FIG. 6 depicts an image 171 of scattered orders measured by a metrology system such as metrology system 100. As illustrated in FIG. 6, the bright spot in the center of the image is associated with the zero order beam.

The intensity of each order can be extracted in many ways. In some embodiments, the diffraction orders are spatially separated at the detector. In these embodiments, the diffraction orders are individually detected by the detector array, and the outputs of pixels associated with the same diffraction order are combined (i.e., added). In this manner, detected diffraction orders are discriminated by accumulating photon counts of pixels associated with each particular diffraction order. This scenario is more likely to occur when measuring relatively small pitch features or when measuring with a beam having a relatively small divergence.

In some other embodiments, the diffraction orders spatially overlap. This is typical when performing TSAXS metrology on relatively large targets (e.g., targets having a pitch of one micrometer or more) with a relatively small wafer-detector distance, D (e.g., D less than 2 meters) or when measuring with a beam having a relatively large divergence. In these embodiments, the diffraction orders are separated in Q space to estimate values of structural parameters of interest. In some of these embodiments, the shape of the diffracted order is estimated based on available beam shape information and an accurate beam model is employed to account for Q resolution loss due to overlap. This is particularly important to meet the requirements of on-device metrology. Some existing metrology systems are unable to perform separation of overlapping orders because the systems employ beam stops that prevent access to beam shape information needed to estimate the shape of the diffracted orders. Such a system is described in U.S. Pat. No. 9,606,073 to Mazor, et al. entitled "X-ray scatterometry apparatus," the contents of which is incorporated herein by reference in its entirety.

When the diffraction orders spatially overlap at the detector the pixel outputs cannot simply be combined to determine the intensity associated with a particular diffraction order. In these embodiments, a measurement model is employed to deconvolve the diffraction orders to discriminate the measured intensity of each detected diffraction order.

Figure 7:
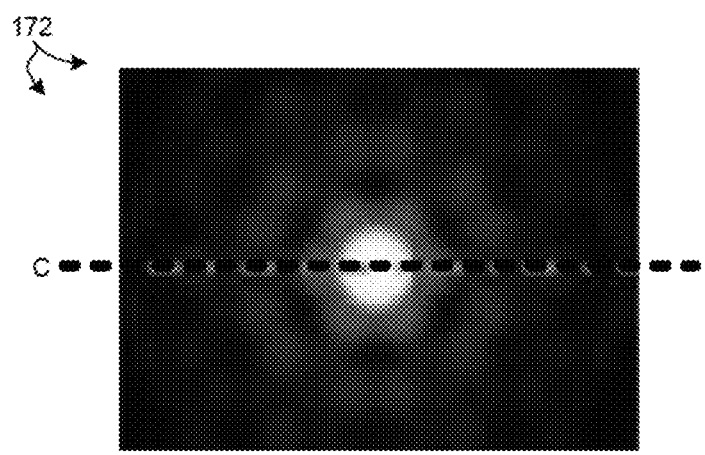
FIG. 7 depicts an image 172 of scattered orders measured by a metrology system such as metrology system 100.
Figure 8:
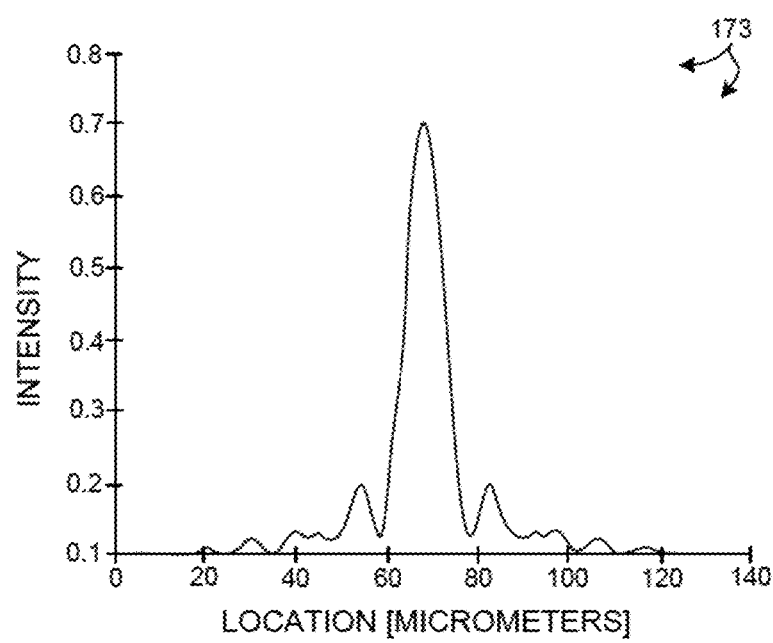
FIG. 8 depicts a plot 173 of the intensity profile associated with the cross-section, C, of image 172 depicted in FIG. 4.

In some embodiments, overlapped orders are deconvolved based on the measured zero order beam shape. In some embodiments, this deconvolution is performed in real time. The beam profile of higher diffracted orders (i.e., orders greater than zero) is modeled based on the profile of the zero order beam. FIG. 7 depicts an image 172 of scattered orders measured by a metrology system such as metrology system 100. FIG. 8 depicts a plot 173 of the intensity profile associated with the cross-section, C, of image 172 depicted in FIG. 7. The relatively high intensity zero order beam provides a very accurate beam profile that is used to model the higher diffraction orders.

In some embodiments, the intensity of each higher diffraction order is estimated relative to the measured zero order beam by simple division of intensity, or otherwise. In this manner, measurement uncertainty associated with the relatively weak, higher order signals is significantly reduced.

By estimating the intensity of higher diffraction orders based on the simultaneously measured zero order beam, scattering signals are separated from system perturbations during data collection. Perturbations due to misalignment of optical components (e.g., slits, optics, spot shape) and perturbations along the beam path (e.g., $n_1$ and $n_2$) are mitigated in real-time. By using all scattered intensities, including the zero order, the dependence of scattered intensities on thickness or material density of the measured specimen is isolated from flux perturbations before and after the wafer.

The physical conversion of a high energy photon into an electron cloud in a crystal of the detector also sets a detection limit on high q resolution, short optical path length TSAXS systems. The electron cloud causes a single photon event to be detected across several pixels, when the pixel size is small enough to perform short optical path length TAXS metrology of semiconductor structures.

In another aspect, the location of the centroid of a cloud of electrons stimulated by a photon conversion event is calculated by the detector (e.g., detector 119). The location of the centroid provides the location of the incident photon with sub-pixel accuracy. This effectively reduces the pixel size and enables Q resolution beyond the geometric limit described by equation (1). Sub-pixel spatial interpolation as described herein is preferred for TSAXS measurements of semiconductor structures with a wafer-detector distance less than one meter.

In some embodiments, a TSAXS system having a relatively short optical path length is configured with a horizontal optical path incident on a wafer positioned vertically (i.e., normal to wafer surface is approximately perpendicular to the gravity vector). However, in some other embodiments, a TSAXS system having a relatively short optical path length is configured with a vertical optical path incident on a wafer positioned horizontally (i.e., normal to wafer surface is approximately parallel to the gravity vector). By orienting the beam line vertically, a smaller tool footprint may be achieved and wafer handling is simplified.

In a further aspect, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

In some embodiments, the target under measurement is periodic in one dimension (e.g., a FinFET structure). As such, it is only necessary to minimize the PSF of the TSAXS system at the detector in one direction. However, in some other embodiments, the target under measurement is periodic in two dimensions (e.g., VNAND contacts). In these embodiments, it is advantageous to minimize the PSF of the TSAXS system at the detector in both directions.

In another aspect, the TSAXS system is configured to measure a target based on spatially separated orders in one direction, but overlapping orders in the orthogonal direction. In some of these embodiments, the value(s) of one or more parameters of interest are determined in the direction where the diffracted orders are spatially separated. These parameter values are subsequently employed to determine the value(s) of one or more parameters of interest based on the overlapping orders.

In some embodiments, x-ray illumination source 110, focusing optics 111, slits 112 and 113, or any combination thereof, are maintained in the same atmospheric environment as specimen 101 (e.g., gas purge environment). However, in some embodiments, the optical path length between and within any of these elements is long and X-ray scattering in air contributes noise to the image on the detector. Hence in some embodiments, any of x-ray illumination source 110, focusing optics 111, and slits 112 and 113 are maintained in a localized, vacuum environment separated from one another and the specimen (e.g., specimen 101) by vacuum windows.

Similarly, in some embodiments, x-ray detector 119 is maintained in the same atmospheric environment as specimen 101 (e.g., gas purge environment). However, in some embodiments, the distance between specimen 101 and x-ray detector 119 is lengthy and X-ray scattering in air contributes noise to the detected signals. Hence in some embodiments, one or more of the x-ray detectors (e.g., detector 119) is maintained in a localized, vacuum environment separated from the specimen (e.g., specimen 101) by a vacuum window.

Figure 9:
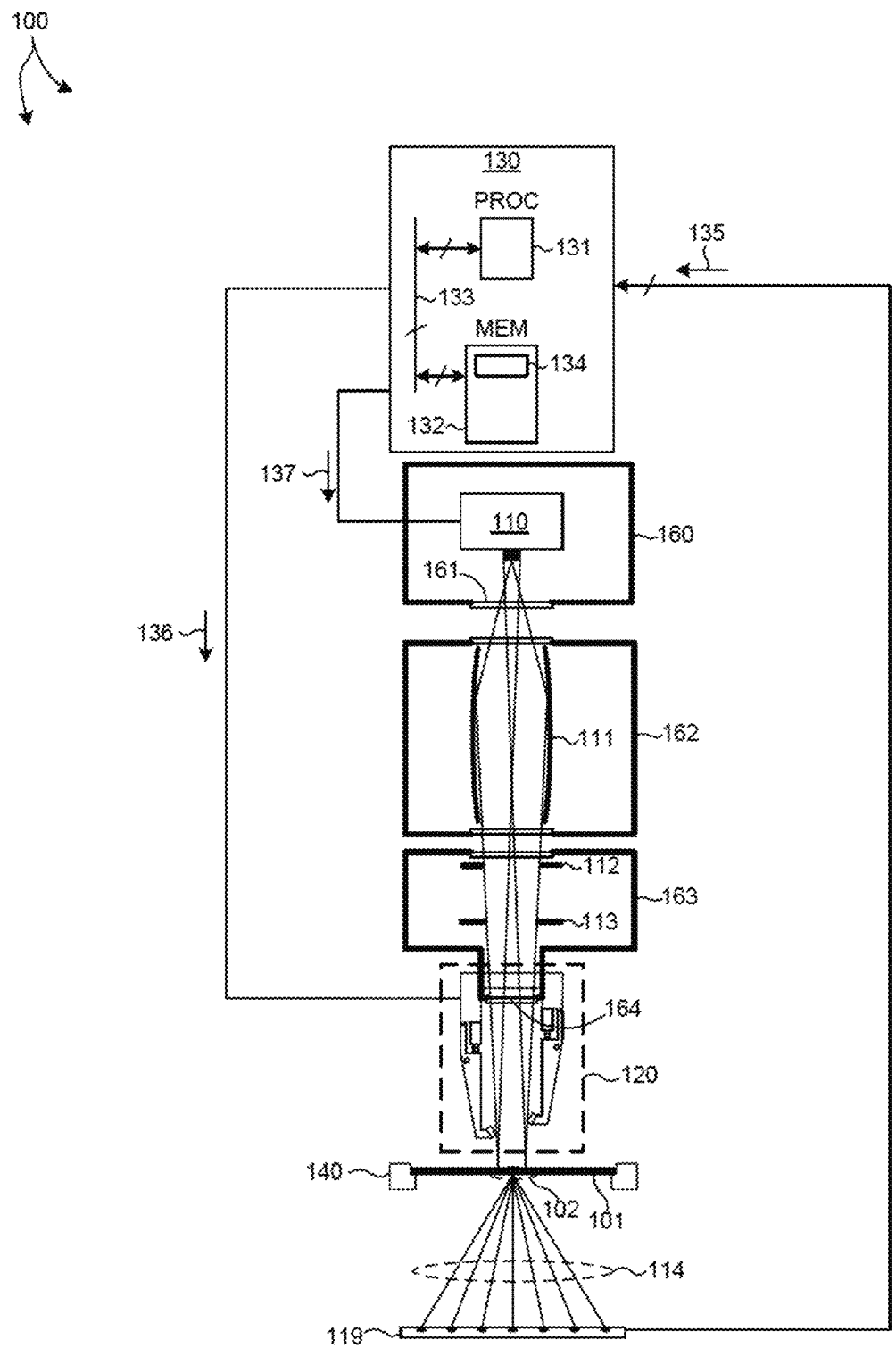
FIG. 9 is a diagram illustrative of elements of metrology system 100 contained in vacuum environments separate from the specimen under measurement.

FIG. 9 is a diagram illustrative of a vacuum chamber 160 containing x-ray illumination source 110, vacuum chamber 162 containing focusing optics 111, and vacuum chamber 163 containing slits 112 and 113. The openings of each vacuum chamber are covered by vacuum windows. For example, the opening of vacuum chamber 160 is covered by vacuum window 161. Similarly, the opening of vacuum chamber 163 is covered by vacuum window 164. The vacuum windows may be constructed of any suitable material that is substantially transparent to x-ray radiation (e.g., Kapton, Beryllium, etc.). A suitable vacuum environment is maintained within each vacuum chamber to minimize scattering of the illumination beam. A suitable vacuum environment may include any suitable level of vacuum, any suitable purged environment including a gas with a small atomic number (e.g., helium), or any combination thereof. In this manner, as much of the beam path as possible is located in vacuum to maximize flux and minimize scattering.

In some embodiments, the entire optical system, including specimen 101, is maintained in vacuum. However, in general, the costs associated with maintaining specimen 101 in vacuum are high due to the complexities associated with the construction of specimen positioning system 140.

In another further aspect, beam shaping slit mechanism 120 is mechanically integrated with vacuum chamber 163 to minimize the beam path length subject to the atmospheric environment. In general, it is desirable to encapsulate as much of the beam as possible in vacuum before incidence with specimen 101. In some embodiments, the vacuum beam line extends into a hollow, cylindrically shaped cavity at the input of beam shaping slit mechanism 120. Vacuum window 164 is located at the output of vacuum chamber 163 within beam shaping slit mechanism 120 such that incoming beam 115 remains in vacuum within a portion of beam shaping slit mechanism 120, then passes through vacuum window 164 before interaction with any of slits 126-129 and specimen 101.

In the embodiment depicted in FIG. 1, focusing optics 111, slits 112 and 113, and beam shaping slit mechanism 120 are maintained in a controlled environment (e.g., vacuum) within a flight tube 118.

In another further aspect, computing system 130 is configured to generate a structural model (e.g., geometric model, material model, or combined geometric and material model) of a measured structure of a specimen, generate a TSAXS response model that includes at least one geometric parameter from the structural model, and resolve at least one specimen parameter value by performing a fitting analysis of TSAXS measurement data with the TSAXS response model. The analysis engine is used to compare the simulated TSAXS signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 10:
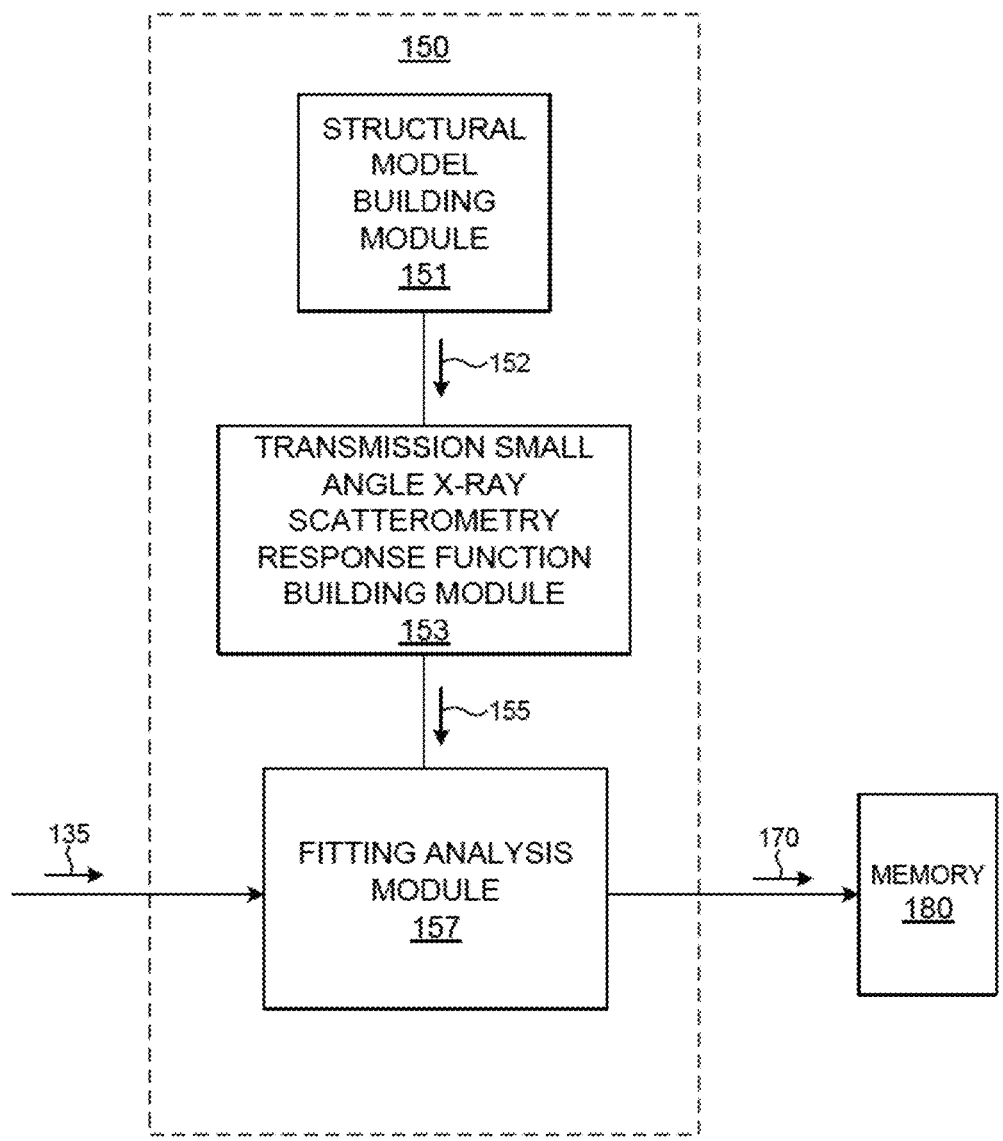
FIG. 10 is a diagram illustrative of a model building and analysis engine 150 configured to resolve specimen parameter values based on x-ray scatterometry data in accordance with the methods described herein.

FIG. 10 is a diagram illustrative of an exemplary model building and analysis engine 150 implemented by computing system 130. As depicted in FIG. 10, model building and analysis engine 150 includes a structural model building module 151 that generates a structural model 152 of a measured structure of a specimen. In some embodiments, structural model 152 also includes material properties of the specimen. The structural model 152 is received as input to TSAXS response function building module 153. TSAXS response function building module 153 generates a TSAXS response function model 155 based at least in part on the structural model 152. In some examples, the TSAXS response function model 155 is based on x-ray form factors, $$F(\vec{q}) = \int \rho(\vec{r}) e^{-i\vec{q}\cdot\vec{r}} d(\vec{r}) \tag{3}$$

where F is the form factor, q is the scattering vector, and $\rho(r)$ is the electron density of the specimen in spherical coordinates. The x-ray scattering intensity is then given by $$I(\vec{q}) = F^*F. \tag{4}$$

TSAXS response function model 155 is received as input to fitting analysis module 157. The fitting analysis module 157 compares the modeled TSAXS response with the corresponding measured data to determine geometric as well as material properties of the specimen.

In some examples, the fitting of modeled data to experimental data is achieved by minimizing a chi-squared value. For example, for TSAXS measurements, a chi-squared value can be defined as $$\chi^2_{SAXS} = \frac{1}{N_{SAXS}} \sum_j^{N_{SAXS}} \frac{(S_j^{SAXS\ model}(v_1, \ldots, v_L) - S_j^{SAXS\ experiment})^2}{\sigma^2_{SAXS,j}} \tag{5}$$

Where, $S_j^{SAXS\ experiment}$ is the measured TSAXS signals 135 in the "channel" j, where the index j describes a set of system parameters such as diffraction order, energy, angular coordinate, etc. $S_j^{SAXS\ model}(v_1, \ldots, v_L)$ is the modeled TSAXS signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (5) assumes that the uncertainties associated with different channels are uncorrelated. In examples where the uncertainties associated with the different channels are correlated, a covariance between the uncertainties, can be calculated. In these examples a chi-squared value for x-ray scatterometry measurements can be expressed as $$\chi^2_{SAXS} = \frac{1}{N_{SAXS}} \left( \vec{S}_j^{SAXS.model}(v_1, \ldots, v_M) - \vec{S}_j^{SAXS.experiment} \right)^T V_{SAXS}^{-1} \left( \vec{S}_j^{SAXS.model}(v_1, \ldots, v_M) - \vec{S}_j^{SAXS.experiment} \right) \tag{6}$$

where, $V_{SAXS}$ is the covariance matrix of the SAXS channel uncertainties, and T denotes the transpose.

In some examples, fitting analysis module 157 resolves at least one specimen parameter value by performing a fitting analysis on TSAXS measurement data 135 with the TSAXS response model 155. In some examples, $\chi^2_{SAXS}$ is optimized.

As described hereinbefore, the fitting of TSAXS data is achieved by minimization of chi-squared values. However, in general, the fitting of TSAXS data may be achieved by other functions.

The fitting of TSAXS data is advantageous for any type of TSAXS technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing TSAXS beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 150 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In one further aspect, metrology tool 100 includes a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 117.

As illustrated in FIG. 1, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 116 on specimen 101 is determined by computing system 130. In one example, pattern recognition techniques are applied by computing system 130 to determine the location and area of incidence of illumination beam 116 on specimen 101 based on measurement data 135. In some examples, computing system 130 communicates command signal 137 to illumination source 110 to select the desired illumination wavelength and command signal 136 to beam shaping mechanism 120 to redirect and reshape illumination beam 116 such that incident illumination beam 116 arrives at the desired location and angular orientation with respect to specimen 101. In some other examples, computing system 130 communicates a command signal to wafer positioning system 140 to position and orient specimen 101 such that incident illumination beam 116 arrives at the desired location and angular orientation with respect to specimen 101.

In another aspect, x-ray scatterometry measurement data is used to generate an image of a measured structure based on the measured intensities of the detected diffraction orders. In some embodiments, a TSAXS response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on TSAXS measurements, a map of the specimen generated from the same TSAXS data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In a further aspect, model building and analysis engine 150 is employed to generate models for combined x-ray and optical measurement analysis. In some examples, optical simulations are based on, e.g., rigorous coupled-wave analysis (RCWA) where Maxwell's equations are solved to calculate optical signals such as reflectivities for different polarizations, ellipsometric parameters, phase change, etc.

Values of one or more parameters of interest are determined based on a combined fitting analysis of the detected intensities of the x-ray diffraction orders at the plurality of different angles of incidence and detected optical intensities with a combined, geometrically parameterized response model. The optical intensities are measured by an optical metrology tool that may or may not be mechanically integrated with an x-ray metrology system, such as system 100 depicted in FIG. 1. Further details are described in U.S. Patent Publication No. 2014/0019097 and U.S. Patent Publication No. 2013/0304424, the contents of each are incorporated herein by reference it their entirety.

In some embodiments, the metrology target characterized by x-ray scatterometry measurements as described herein is located within a scribe line of the wafer under measurement. In these embodiments, the metrology target is sized to fit within the width of the scribe line. In some examples, the scribe line width is less than eighty micrometers. In some examples, the scribe line is less than fifty micrometers. In general, the width of the scribe lines employed in semiconductor manufacturing is trending smaller.

In some embodiments, the metrology target characterized by x-ray scatterometry measurements as described herein is located within an active die area of the wafer under measurement and is a part of a functional integrated circuit (e.g., memory, image sensor, logic device, etc.).

In general, a metrology target is characterized by an aspect ratio defined as a maximum height dimension (i.e., dimension normal to the wafer surface) divided by a maximum lateral extent dimension (i.e., dimension aligned with the wafer surface) of the metrology target. In some embodiments, the metrology target under measurement has an aspect ratio of at least twenty. In some embodiments, the metrology target has an aspect ratio of at least forty.

Figure 11A:
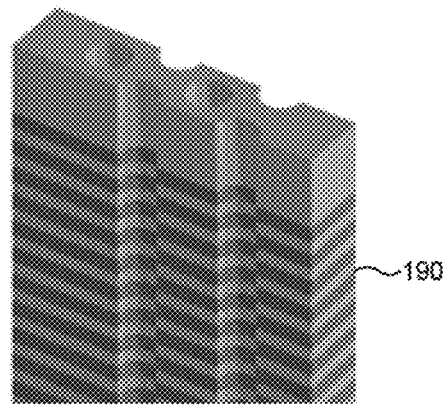
FIGS. 11A-11C depict an isometric view, a top view, and a cross-sectional view, respectively, of a typical 3D FLASH memory device 190 subject to measurement in the manner described herein.
Figure 11B:
Figure 11C:
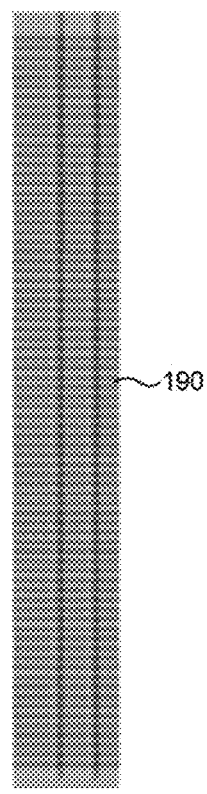
Figure 12:
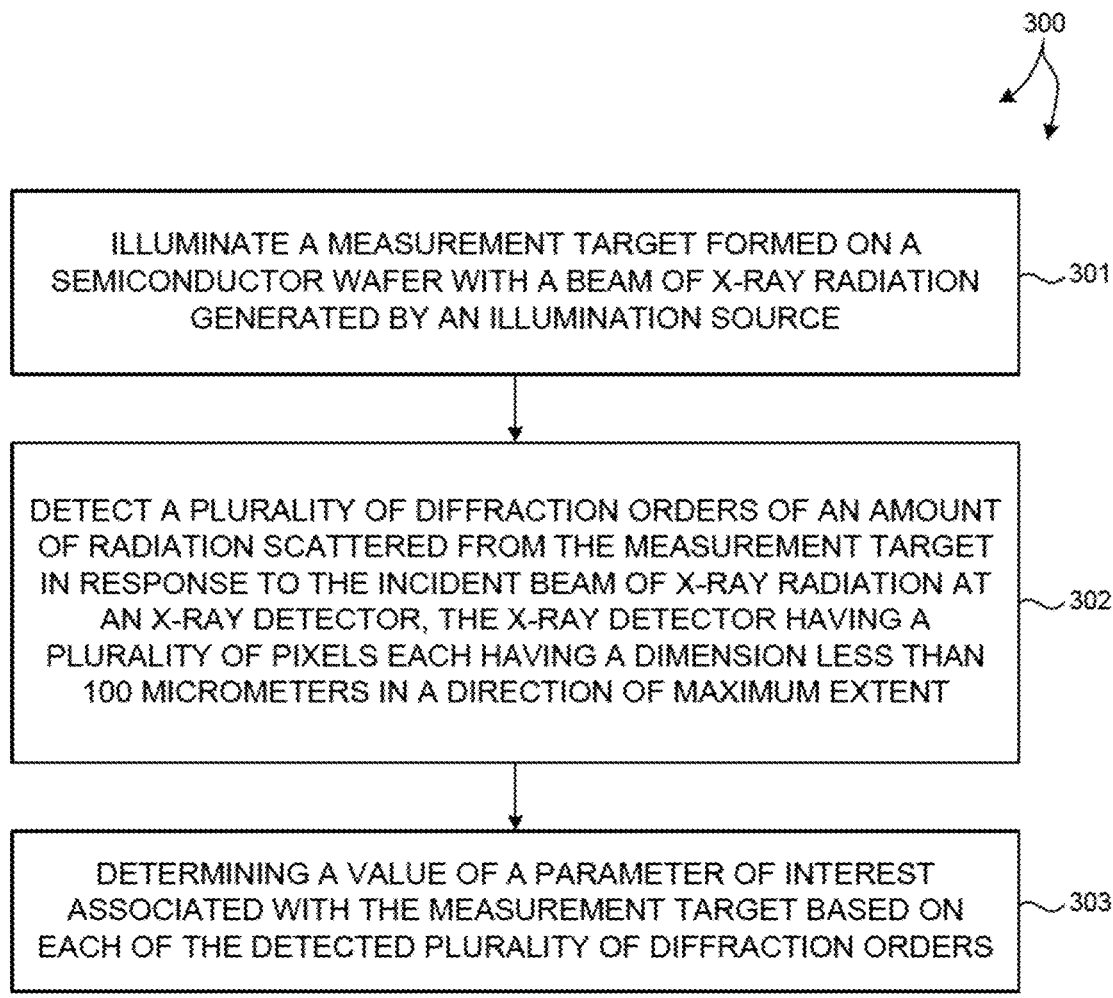
FIG. 12 depicts a flowchart illustrative of an exemplary method 300 of measuring structures based on small footprint x-ray scatterometry measurements as described herein.

FIGS. 11A-11C depict an isometric view, a top view, and a cross-sectional view, respectively, of a typical 3D FLASH memory device 190 subject to measurement in the manner described herein. The total height (or equivalently depth) of memory device 190 ranges from one to several micrometers. Memory device 190 is a vertically manufactured device. A vertically manufactured device, such as memory device 190, essentially turns a conventional, planar memory device 90 degrees, orienting the bit line and cell string vertically (perpendicular to wafer surface). To provide sufficient memory capacity, a large number of alternating layers of different materials are deposited on the wafer. This requires patterning processes to perform well to depths of several microns for structures with a maximum lateral extent of one hundred nanometers or less. As a result, aspect ratios of 25 to 1 or 50 to 1 are not uncommon.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the detector 119 and the illumination optical elements in any manner known in the art. For example, the one or more computing systems 130 may be coupled to computing systems associated with the detector 119. In another example, the detector 119 may be controlled directly by a single computer system coupled to computer system 130.

The computer system 130 may be configured to receive and/or acquire data or information from the subsystems of the system (e.g., detector 119, and the like) by a transmission medium that may include wireline and/or wireless portions.

In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 180) via a data link. For instance, intensities measured by detector 119 may be stored in a permanent or semi-permanent memory device (e.g., memory 132 or 180). In this regard, the measurement results may be imported from on-board memory or from an external memory system. Moreover, the computer system 130 may send data to other systems via a transmission medium. For instance, specimen parameter values 170 determined by computer system 130 may be stored in a permanent or semi-permanent memory device (e.g., memory 180). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, a scatterometry analysis as described herein is implemented as part of a fabrication process tool. Examples of fabrication process tools include, but are not limited to, lithographic exposure tools, film deposition tools, implant tools, and etch tools. In this manner, the results of a TSAXS analysis are used to control a fabrication process. In one example, TSAXS measurement data collected from one or more targets is sent to a fabrication process tool. The TSAXS measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, and material parameters such as electron density, composition, grain structure, morphology, stress, strain, and elemental identification.

FIG. 14 illustrates a method 300 suitable for implementation by the metrology system 100 of the present invention. In one aspect, it is recognized that data processing blocks of method 300 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 301, a measurement target formed on a semiconductor wafer is illuminated with a beam of x-ray radiation generated by an illumination source.

In block 302, a plurality of diffraction orders of an amount of radiation scattered from the measurement target in response to the incident beam of x-ray radiation are detected at an x-ray detector. The x-ray detector includes a plurality of pixels each having a dimension less than 100 micrometers in a direction of maximum extent.

In block 303, a value of a parameter of interest associated with the measurement target is determined based on each of the detected plurality of diffraction orders.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
    an x-ray illumination source configured to generate an amount of x-ray radiation;
    one or more x-ray optical elements configured to direct the amount of x-ray radiation toward a measurement target as a focused beam, wherein the focused beam is incident on the measurement target;
    a specimen positioning system that positions the measurement target at a plurality of orientations with respect to the focused beam incident on the measurement target;
    an x-ray detector having a plurality of pixels each having a dimension less than 100 micrometers in a direction of maximum extent, the x-ray detector configured to detect each of a plurality of diffraction orders of an amount of radiation scattered from the measurement target in response to the focused beam incident on the measurement target at each of the plurality of orientations; and
    a computing system configured to determine a value of a parameter of interest associated with the measurement target based on each of the detected plurality of diffraction orders at each of the plurality of orientations.

2. The metrology system of claim 1, wherein the detector is a photon-counting detector.

3. The metrology system of claim 1, wherein the detector is an integrating detector.

4. The metrology system of claim 1, wherein an optical path length between the illumination source and the x-ray detector is less than three meters.

5. The metrology system of claim 1, wherein the one or more x-ray optical elements focuses the focused beam to a location in an optical path of the metrology system that is less than 200 millimeters before the wafer surface, at the measurement target, at the detector, or any location in the optical path between the measurement target and the detector.

6. The metrology system of claim 1, wherein each of the plurality of pixels of the x-ray detector has a point spread function smaller than a first pixel of the plurality of pixels such that a portion of a diffracted beam incident on a second pixel adjacent to the first pixel is less than 0.1% of a portion of the diffracted beam incident on the first pixel.

7. The metrology system of claim 1, wherein a photo-sensitive volume of the x-ray detector includes Cadmium Telluride, Germanium, Gallium Arsenide, or any combination thereof.

8. The metrology system of claim 7, wherein the photo-sensitive volume is at least 500 micrometers thick.

9. The metrology system of claim 1, wherein the x-ray detector interpolates between a plurality of energy levels at each pixel of the x-ray detector.

10. The metrology system of claim 1, wherein the x-ray detector determines a location of a centroid of a photon interaction with the detector with sub-pixel resolution.

11. The metrology system of claim 1, wherein two or more of the diffracted orders spatially overlap on the detector, and wherein the computing system is further configured to:
    determine an intensity of each of the overlapping diffraction orders based on a beam shape of a zeroth diffraction order.

12. A method comprising:
    illuminating a measurement target formed on a semiconductor wafer with a beam of x-ray radiation generated by an illumination source;
    detecting a plurality of diffraction orders of an amount of radiation scattered from the measurement target in response to the incident beam of x-ray radiation at an x-ray detector, the x-ray detector having a plurality of pixels each having a dimension less than 100 micrometers in a direction of maximum extent; and determining a value of a parameter of interest associated with the measurement target based on each of the detected plurality of diffraction orders.

13. The method of claim 12, wherein the x-ray detector is a photon-counting detector or an integrating detector.

14. The method of claim 12, the x-ray detector having a plurality of pixels each having a size less than 50 micrometers in a direction of maximum extent.

15. The method of claim 12, wherein an optical path length between the illumination source and the x-ray detector is less than three meters.

16. The method of claim 12, further comprising:
interpolating between a plurality of energy levels at each pixel of the x-ray detector.

17. A metrology system comprising:
an x-ray illumination source configured to generate an amount of x-ray radiation;
one or more x-ray optical elements configured to direct the amount of x-ray radiation toward a measurement target as a focused beam, wherein the focused beam is incident on the measurement target;
a specimen positioning system that positions the measurement target at a plurality of orientations with respect to the focused beam incident on the measurement target;
an x-ray detector having a plurality of pixels each having a dimension less than 50 micrometers in a direction of maximum extent, the x-ray detector configured to detect each of a plurality of diffraction orders of an amount of radiation scattered from the measurement target in response to the focused beam incident on the measurement target at each of the plurality of orientations; and
a non-transitory, computer-readable medium, comprising:
code for causing a computing system to determine a value of a parameter of interest associated with the measurement target based on each of the detected plurality of diffraction orders at the plurality of different orientations.

18. The metrology system of claim 17, wherein the x-ray detector is a photon-counting detector or an integrating detector.

19. The metrology system of claim 17, wherein an optical path length between the illumination source and the x-ray detector is less than three meters.

20. The metrology system of claim 17, wherein the x-ray detector determines a location of a centroid of a photon interaction with the detector with sub-pixel resolution.

* * * * *